(12) United States Patent
Kurita et al.

(10) Patent No.: US 10,604,846 B2
(45) Date of Patent: Mar. 31, 2020

(54) THIN FILM ENCAPSULATION MASK PREHEAT AND SUBSTRATE BUFFER CHAMBER

(71) Applicant: Applied Materials, Inc., Santa Clara, CA (US)

(72) Inventors: Shinichi Kurita, San Jose, CA (US); Makoto Inagawa, Palo Alto, CA (US); Suhas Bhoski, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/787,328

(22) Filed: Oct. 18, 2017

(65) Prior Publication Data

US 2018/0119285 A1 May 3, 2018

Related U.S. Application Data

(60) Provisional application No. 62/414,092, filed on Oct. 28, 2016.

(51) Int. Cl.
| | |
|---|---|
| C23C 16/52 | (2006.01) |
| C23C 16/48 | (2006.01) |
| F27D 11/10 | (2006.01) |
| C23C 14/56 | (2006.01) |
| C23C 16/54 | (2006.01) |
| C23C 14/04 | (2006.01) |
| C23C 16/04 | (2006.01) |
| F27B 5/14 | (2006.01) |
| C23C 16/02 | (2006.01) |

(52) U.S. Cl.
CPC ............ *C23C 16/52* (2013.01); *C23C 14/042* (2013.01); *C23C 14/568* (2013.01); *C23C 16/0209* (2013.01); *C23C 16/042* (2013.01); *C23C 16/48* (2013.01); *C23C 16/54* (2013.01); *F27B 5/14* (2013.01); *F27D 11/10* (2013.01)

(58) Field of Classification Search
USPC ....... 118/719, 721, 50, 58, 64, 69, 504, 505, 118/724, 725, 641; 219/455.12, 553
See application file for complete search history.

(56) References Cited

U.S. PATENT DOCUMENTS

| | | | |
|---|---|---|---|
| 5,466,060 A * | 11/1995 | Hoffman | A47B 88/493 312/334.11 |
| 5,674,786 A | 10/1997 | Turner et al. | |
| 5,904,478 A * | 5/1999 | Weaver | H01L 21/67109 432/239 |

(Continued)

*Primary Examiner* — Yewebdar T Tadesse
(74) *Attorney, Agent, or Firm* — Patterson + Sheridan, LLP

(57) ABSTRACT

Embodiments described herein relate to a thermal chamber utilized in the processing of display substrates. The thermal chamber may be part of a larger processing system configured to manufacture OLED devices. The thermal chamber may be configured to heat and cool masks and/or substrates utilized in deposition processes in the processing system. The thermal chamber may include a chamber body defining a volume sized to receive one or more cassettes containing a plurality of masks and/or substrates. Heaters coupled to the chamber body within the volume may be configured to controllably heat masks and/or substrates prior to deposition processes and cool the masks and/or substrates after deposition processes.

21 Claims, 6 Drawing Sheets

(56) References Cited

U.S. PATENT DOCUMENTS

| | | | |
|---|---|---|---|
| 2003/0132213 A1* | 7/2003 | Kim | H01L 21/67109 219/390 |
| 2006/0278629 A1* | 12/2006 | Gagas | A47J 36/2483 219/385 |
| 2010/0041245 A1* | 2/2010 | Luoh | C23C 16/0209 438/788 |

* cited by examiner

THIN FILM ENCAPSULATION MASK PREHEAT AND SUBSTRATE BUFFER CHAMBER

CROSS-REFERENCE TO RELATED APPLICATION

This application claims benefit of U.S. Provisional Patent Application Ser. No. 62/414,092, filed Oct. 28, 2017, which is incorporated herein by reference.

BACKGROUND

Field

Embodiments of the present disclosure generally relate to a substrate processing system for large area substrates. More specifically, embodiments described herein relate to a mask preheat chamber where substrates may be stored temporarily.

Description of the Related Art

Organic light emitting diodes (OLED) are used in the manufacture of television screens, computer monitors, mobile phones, etc. for displaying information. A typical OLED may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

With the marketplace's acceptance of flat panel technology, the demand for larger displays, increased production and lower manufacturing costs have driven equipment manufacturers to develop new systems that accommodate larger size glass substrates for flat panel display fabricators. In addition, the ability to efficiently and cost effectively integrate various system components into complex processing operations reduces the cost of ownership. However, with the adoption of such large equipment for processing large area substrates, integrating various components of the systems becomes time consuming and difficult. Additionally, there are instances when substrate queue times are not synchronized such that one or more substrates may need to be temporarily stored.

Thus, what is needed in the art are improved apparatus for manufacturing OLED display devices.

SUMMARY

In one embodiment, a thermal chamber is provided. The thermal chamber includes a chamber body defining a volume sized to receive one or more masks and substrates therein and a lid member may be slidably coupled to the chamber body outside the volume. A heating member and a temperature measurement apparatus may be coupled to the chamber body. The heating member may be disposed within the volume and the temperature measurement apparatus may be coupled to the chamber body. A platform may be disposed within the volume opposite the lid member and the platform may be movably coupled to the chamber body.

In another embodiment, a thermal chamber is provided. The thermal chamber includes a chamber body defining a volume and a lid member coupled to the chamber body outside the volume. A reflective heating member may be coupled to the chamber body within the volume and a thermocouple may be coupled to the chamber body. A platform may be coupled to the chamber body and may be movably disposed within the volume.

In yet another embodiment, a thermal chamber is provided. The thermal chamber includes a chamber body defining a volume and a lid assembly slidably coupled to the chamber body. A slit valve may be coupled to the chamber body below the lid assembly and a thermocouple may be coupled to the chamber body below the slit valve. A plurality of reflective heaters may be coupled to the chamber body within the volume. A platform may also be movably disposed within the volume and an alignment apparatus may be coupled to and extend from the platform. The alignment apparatus may include a bearing member.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a thermal chamber utilized in the processing of display substrates. The thermal chamber may be used to store masks and/or substrates in a thermally controlled environment. The thermal chamber may be part of a larger processing system (See FIG. 5) configured to manufacture OLED devices. The thermal chamber may be configured to heat and cool masks utilized during deposition processes in the processing system. The thermal chamber may also be utilized to store one or more substrates when necessary. The thermal chamber may include a chamber body defining a volume sized to receive one or more cassettes containing a plurality of masks. Heaters coupled to the chamber body within the volume may be configured to controllably heat masks prior to utilizing the masks in a deposition processing chamber and cool the masks after use in a deposition processing chamber.

Figure 1:
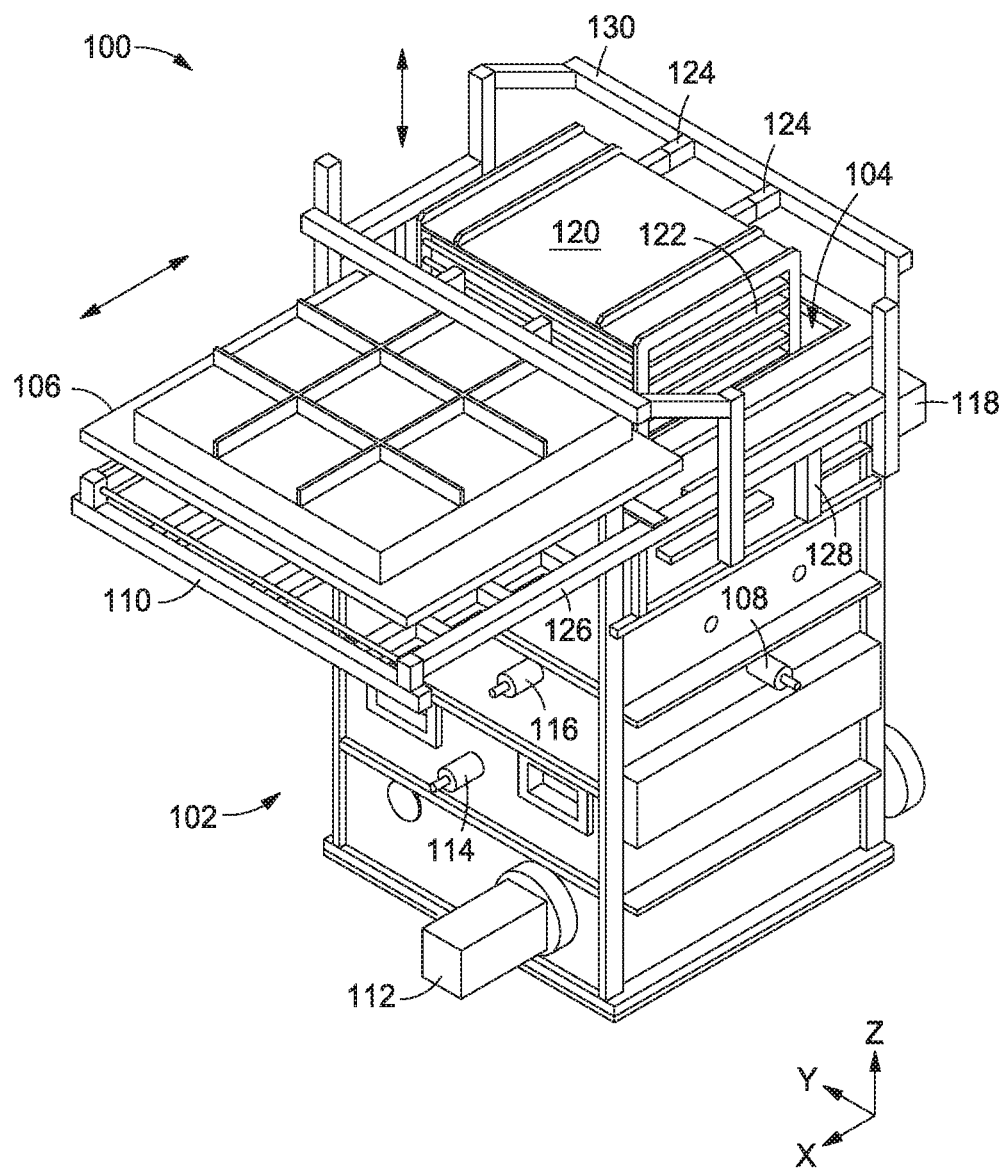
FIG. 1 illustrates a perspective view of a thermal chamber.

FIG. 1 illustrates a perspective view of a thermal chamber 100. The thermal chamber 100 includes a chamber body 102 which defines a volume 104. The volume 104 may be sized to receive one or more cassettes 120 having one or more masks 122 removably disposed therein. The cassettes 120 may be delivered to the chamber 100 by a crane or a similar apparatus and positioned within the volume 104. A frame member 130 may be coupled to the chamber body 102 and one or more alignment actuators 124 may be coupled to the frame member 130. The alignment actuators 124 may be configured to engage a portion of the cassette 120 and assist in positioning the cassette 120 during transfer into the volume 104. In one embodiment, the alignment actuators 124 are air cylinders.

A lid member 106 may also be coupled to the chamber body 102. The lid member 106 may be configured to enclose the volume 104 when the lid member 106 is located in a closed position. A lid support member 110 may also be coupled to the chamber body 102 and may be configured to support and position the lid member 106 when the lid member 106 is located in an open position (as illustrated in FIG. 1). The lid member 106 may be coupled to the lid support member 110. A track member 126 may be coupled to the lid support member 110 and the track member 126 may translate relative to the chamber body 102. In one embodiment, the track member 126 may translate the lid member 106 in a first direction and the cassettes 120 may be translated in a second direction into and out of the volume 104. The first and second directions may be substantially normal to one another.

A lid actuator 128 may be coupled to the chamber body 102 adjacent the track member 126. The lid actuator 128 may be movably coupled to the track member 126 to position the lid member 106 in either the open or closed positions. In one embodiment, the lid actuator 128 is an air cylinder. The translational capability of the lid member 106, the lid support member 110, and the track member 126 enable cassettes 120 and masks 122 to be efficiently placed within the chamber 100.

For example, used masks that need to be cleaned or conditioned may be removed from the chamber 100 by opening the lid member 106 and removing the cassette containing the used masks. New masks may be provided to the chamber 100 by a new cassette and the lid member 106 may then be closed. The exchanging of masks and cassettes may be performed while substrates are processed in the processing system, described in greater detail with reference to FIG. 5, such that when processing chambers in the system require a new mask, a suitable mask is already present and available in the thermal chamber 100. In one embodiment, a first cassette disposed in the chamber 100 may contain unused masks and a second cassette disposed in the chamber 100 may contain used masks. The new masks may be retrieved from the first cassette and utilized in processing chambers of the system and used masks from the processing chambers may be returned to the second cassette. When desired, the second cassette containing used masks may be removed from the chamber 100 and a third cassette with new masks may be positioned within the chamber 100.

A slit valve 118 may also be coupled to the chamber body 102. The slit valve is generally coupled to a transfer chamber of a processing system (See FIG. 5) and the slit valve 118 is configured to allow for passage of the masks 122 to and from the volume 104. A sensor 114 may be coupled to the chamber body 102 and extend into the volume 104. The sensor 114 may be an optical or contact sensor, or the like, and may be configured to detect the presence of the masks 122 (and/or substrates 200) in the volume 104. A cassette sensor 116 may also be coupled to the chamber body 102 and extend into the volume 104. The cassette sensor 116 may be an optical sensor or contact sensor, or the like, and may be configured to detect the presence of the cassettes 120 in the volume 104. In addition, a temperature sensor 108 may be coupled to the chamber body 102 and extend into the volume 104. In one embodiment, the temperature sensor 108 may be a thermocouple configured to contact the masks 122 (and/or substrates 200).

Additionally, the chamber 100 may include a cassette 120 that is utilized to store one or more substrates (not shown). The substrates may be stored temporarily in the chamber 100 such that the chamber 100 is a buffer chamber within a larger system.

The chamber 100 may be configured to create an environment in the volume 104 suitable for conditioning the masks 122, and more specifically, for heating and cooling the masks 122. Substrates (not shown) that may be positioned in the cassettes 120, may also be heated or cooled in the chamber 100. A pumping apparatus 112, may be coupled to the chamber body 102 and may be configured to generate a vacuum in the volume. In one embodiment, the pumping apparatus 112 is a cryogenic pump. The pumping apparatus 112 may generate a vacuum environment in the volume which may be similar to the environment of a transfer chamber to which the chamber 100 is coupled. As such, when the slit valve 118 is opened to receive or discharge one of the masks 122 (or substrate), vacuum may not be broken which may improve the efficiency of transfer.

Figure 2A:
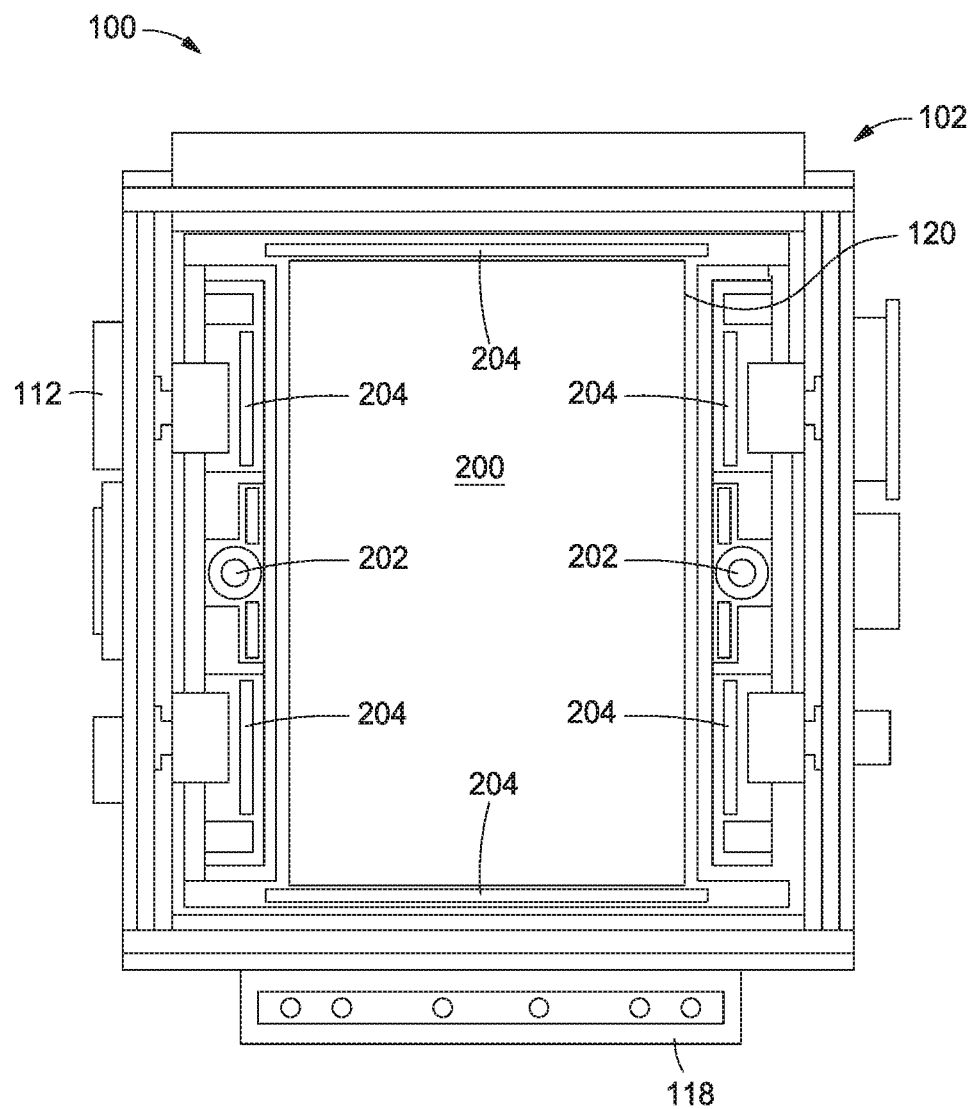
FIG. 2A illustrates a plan view of the thermal chamber of FIG. 1 with a lid assembly removed.
Figure 2B:
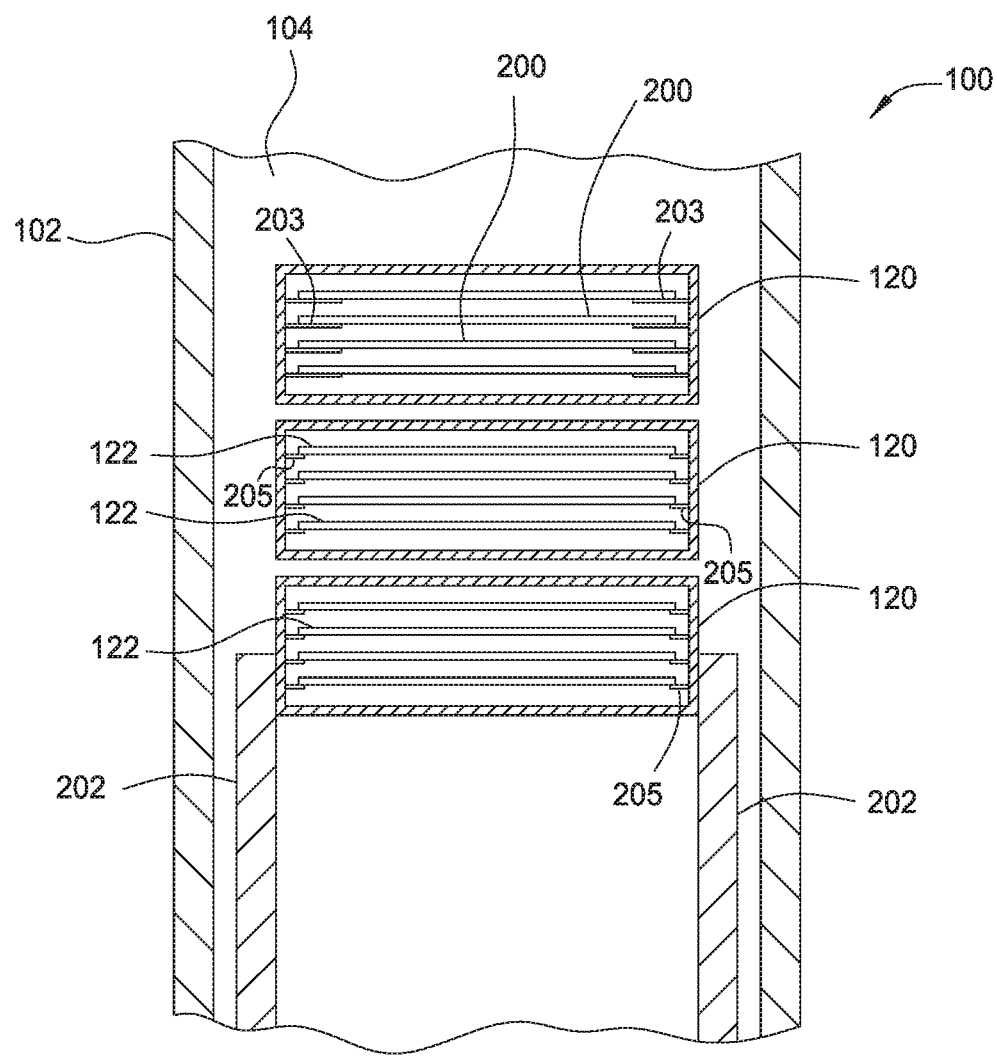
FIG. 2B is a schematic cross-sectional view of a portion of the thermal chamber of FIG. 1.

FIG. 2A illustrates a plan view of the chamber 100 of FIG. 1 with the lid member 106 removed. FIG. 2B is a schematic cross-sectional view of a portion of the chamber 100 of FIG. 1.

As illustrated in FIG. 2A, a cassette 120 containing a substrate 200 is disposed in the chamber 100. Heating members 204 may be coupled to the chamber body 102 within the volume 104 and adjacent to the cassette 120 and the substrate 200. The heating members 204 may be configured to provide heat to the cassette 120 and the substrate 200. The heating members 204 may also aid in cooling the substrate 200. In one embodiment, the heating members 204 may be reflective heaters or resistive heaters. The heating members 204 may be configured to heat and cool down the substrate 200 (and/or a mask 122 (shown in FIG. 1)) to a temperature of between about 20 degrees Celsius and about 100 degrees Celsius, such as between about 40 degrees Celsius and about 80 degrees Celsius. Generally, new masks may be heated and used masks may be cooled. Likewise, substrates may be heated or cooled, as desired.

Although one substrate 200 is shown in the cassette 120 of FIG. 2A, other substrates may be disposed below the substrate 200 as depicted in FIG. 2B. Additionally, other cassettes 120 may be disposed below the cassette 120 shown in FIG. 2A. In one example, the cassette 120 may have one or more substrates 200 disposed therein. The substrates 200 may rest on support members 203 extending from an interior wall of the cassette 120. The cassettes 120 may include one or more masks 122. The substrates 200 may rest on support members 205 extending from an interior wall of the cassette 120. The masks 122 disposed in the cassettes 120 may include one or a combination of masks for chemical vapor deposition (CVD) processes and atomic layer deposition (ALD) processes. The support members 203 may be longer (in the inwardly extending direction) as compared to the support members 205. The greater length of the support members 203 may be utilized to provide additional support to the substrates 200, which are generally more flexible than the masks 122.

The heating members 204 heat the masks 122 (and/or substrates 200) gradually and the heating members 204 may rise in temperature at a rate of greater than about 1° C./minute. In one example, the heating members 204 may heat the masks (and/or substrates) to a desired temperature, such as about 80 degrees Celsius, in less than about 6 hours. The gradual heating process may be performed to prevent exceeding the thermal stress tolerance of the mask material. Further, the heating members 204 may maintain the masks 122 (and/or substrates 200) at a desired target temperature, such as about 80 degrees Celsius, with a variance of less than about 3 degrees Celsius. Used masks may be cooled gradually by the heating members 204 for a duration of less than about 10 hours. For example, a used mask having a temperature of about 80 degrees Celsius may be gradually cooled by the heating members 204 to a temperature of about 40 degrees Celsius.

In one embodiment, the heating members 204 may be set to a first temperature for a first time period and a second temperature for a second time period. The first temperature may be greater than the second temperature. The first temperature may be a rapid ramp-up temperature and the second temperature may be a maintenance temperature (i.e., a desired temperature that is maintained over an extended period of time). In one example, the first time period may be about 4 hours and the second time period may be minutes, hours or up to several days. The first temperature may be about 200 degrees Celsius to about 250 degrees Celsius, for example about 225 degrees Celsius. The second temperature may be about 100 degrees Celsius to about 150 degrees Celsius, for example about 125 degrees Celsius. In one example, the substrates 200 (and/or masks 122 (shown in FIG. 1)) may be heated in the thermal chamber 100 in the first time period at the first temperature to a peak temperature of about 90 degrees Celsius. When the peak temperature is reached, the heating members 204 may be set to the second temperature and the second time period begins. The temperature of the substrates 200 (and/or masks 122 (shown in FIG. 1)) may be reduced in the second time period to about 80 degrees Celsius to a maintenance temperature (i.e., a desired temperature that is maintained over an extended period of time).

One or more linear actuators 202 may also be coupled to the chamber body 102. Although only two linear actuators 202 are shown, it is contemplated that a greater or lesser number of linear actuators 202 may be coupled to the chamber body 102. The linear actuators 202 may be coupled to and configured to translate a platform, described in greater detail in FIGS. 3-4, through the volume 104. In one embodiment, the linear actuators 202 are ball screws.

Figure 3:
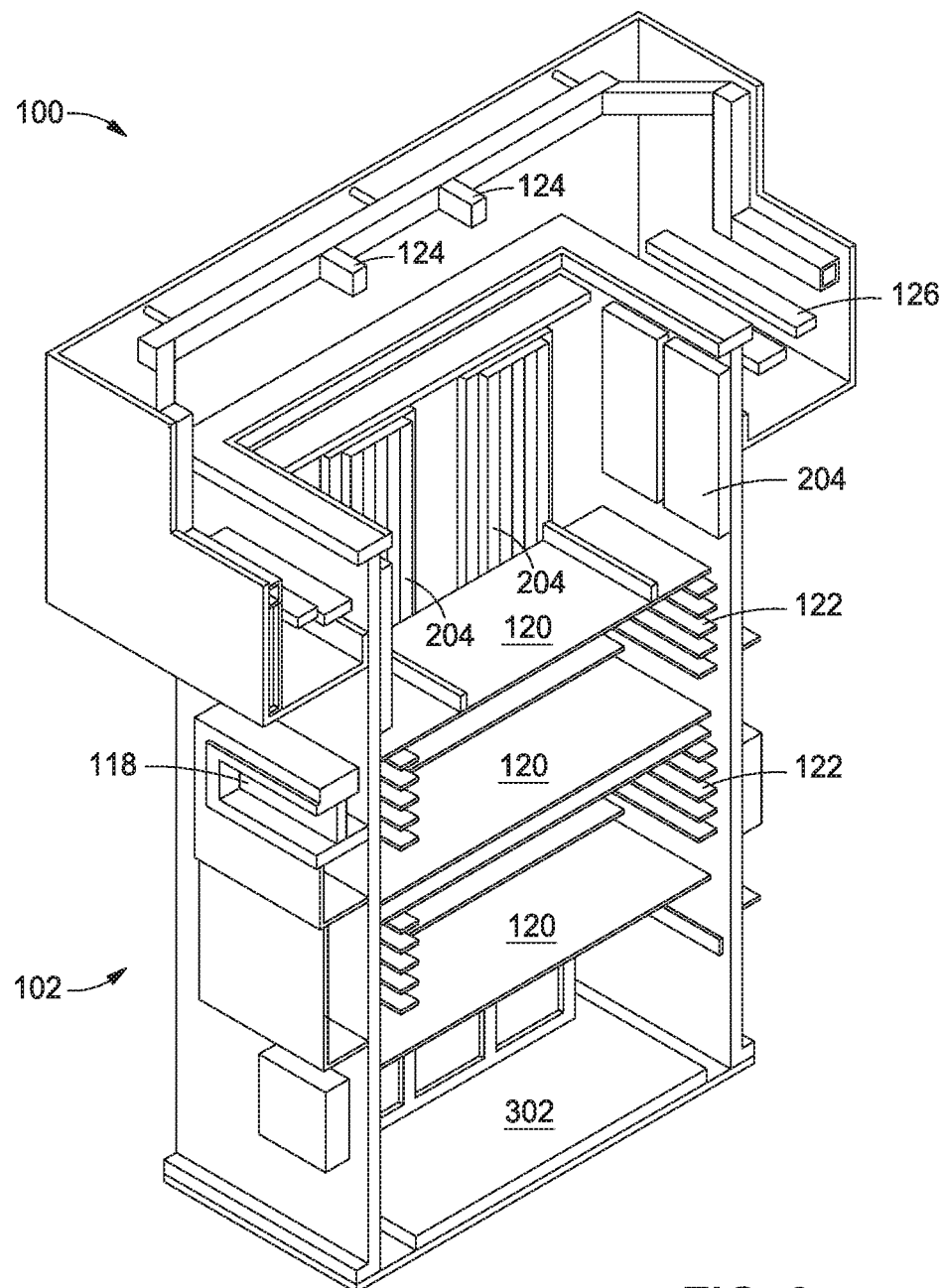
FIG. 3 illustrates a perspective, cross-sectional view of the thermal chamber of FIG. 1.

FIG. 3 illustrates a perspective sectional view of the chamber 100 of FIG. 1. The platform 302, which is coupled to the linear actuators 202 and disposed within the volume 104, may be configured to contact the cassettes 120 and translate the cassettes 120 through the volume 104. Generally, the translation of the cassettes 120 via the platform 302 may be in a second direction which is normal to the first translation direction of the lid member 106. In one embodiment, the platform 302 is configured to translate in the second direction a stroke distance of between about 1500 mm and about 2500 mm, such as between about 2200 mm and about 2300 mm.

The platform 302 may engage the cassettes 120 and position the cassettes 120 within the volume 104. For example, when the cassettes 120 are introduced to the volume 104, the platform 302 may be raised to receive the cassettes 120 and lower the cassettes 120 to a desired position within the volume 104 such that the lid member 106 may be moved to a closed position. The platform 302 may further position the cassettes 120 within the volume 104 relative to the slit valve 118 so that masks 122 may be removed from or placed in the cassettes 120. As illustrated in FIG. 3, two cassettes 120, each containing five masks 122, are disposed within the chamber 100. However, it is contemplated that a greater or lesser number of cassettes 120 and masks 122 (and/or substrates 200) may be utilized in the chamber 100 to achieve desired processing throughput within the processing system described below.

Figure 4:
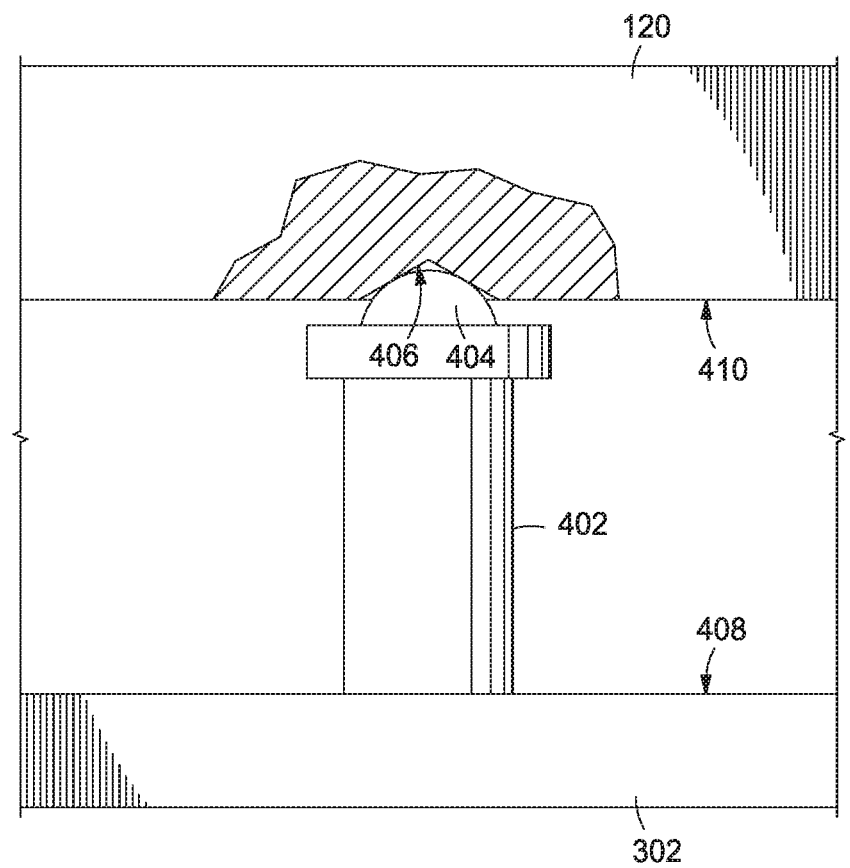
FIG. 4 illustrates a partial cut-away side view of a platform cassette alignment apparatus.

FIG. 4 illustrates a partial cut-away side view of an alignment apparatus 402. The alignment apparatus 402 may be coupled to a top surface 408 of the platform 302 and extend therefrom. The alignment apparatus 402 may be a pin-like, rod-like, or tube-like structure coupled to a bearing member 404. The bearing member 404 may be fixably or movably coupled to the alignment apparatus 402 and may be configured to engage a bottom surface 410 of a cassette 120. An alignment region 406 may be formed in the bottom surface 410 of the cassette 120 and may contact the bearing member 404 of the alignment apparatus 402. The alignment region 406 may be in the form of a recess or the like formed on the bottom surface of the cassette 120.

Although only one alignment apparatus 402 is shown, it is contemplated that two or more alignment apparatus, such as about 4 alignment apparatus may be coupled to the platform 302. In operation, the platform 302 may be raised within the volume 104 and the bearing member 404 of the alignment apparatus 402 may engage the alignment region 406 when the cassette is introduced to the chamber 100. It is believed the alignment apparatus 402 may improve contact alignment between the platform 302 and the cassettes 120 and may also reduce particle generation within the chamber 100. Further, the alignment apparatus 402, in conjunction with the alignment region 406, may prevent dislodging of the cassette 120 from the platform 302 during translation of the platform 302 and cassette 120 through the volume 104.

Figure 5:
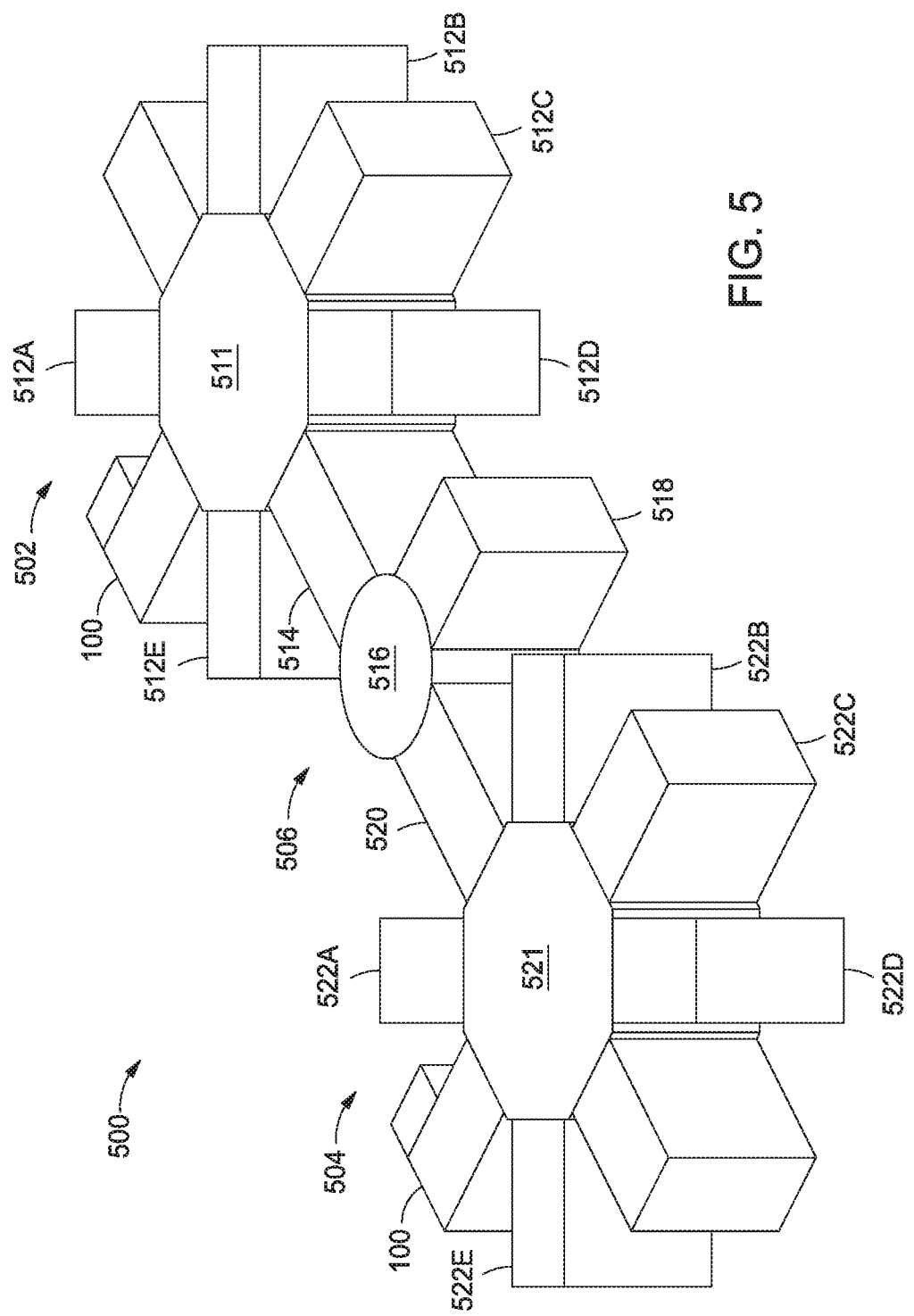
FIG. 5 illustrates a schematic, perspective view of a processing system.

FIG. 5 illustrates a schematic, perspective view of a processing system 500. In one embodiment, the chamber 100 may be beneficially incorporated into the processing system 500. The processing system 500 includes a first cluster tool 502 and a second cluster tool 504 joined by coupling chambers 506. The coupling chambers 506 include a first pass through chamber 514, a turn chamber 516, a second pass through chamber 520, and an optional buffer chamber 518. In some embodiments, the buffer chamber 518 may be replaced by the chamber 100 on one or both of the first cluster tool 502 and the second cluster tool 504 as one or more substrates may be stored therein.

The first cluster tool 502 may include one or more first processing chambers 512A-512E, a first transfer chamber 511, and the chamber 100. The first processing chambers 512A-512E and the thermal chamber 100 may be coupled to the first transfer chamber 511 and disposed raidally thereabout. The second cluster tool 504 may include one or more second processing chambers 522A-522E, a second transfer chamber 521, and the chamber 100. Similar to the first cluster tool 502, the second processing chambers 522A-522E and the thermal chamber 100 may be coupled to the second transfer chamber 521 and disposed radially thereabout.

In operation, first masks may be retrieved from the thermal chamber 100 by a robot disposed in the first transfer chamber 511 and positioned in the first processing chambers 512A-512E. Substrate may be processed in the first processing chambers 512A-512E utilizing the first masks to deposit a first layer on the substrates. After deposition of the first layer, the substrates may be transferred to the second cluster tool 504 through the first pass through chamber 514, the turn chamber 516, and the second pass through chamber 520.

Prior to processing the substrates in the second cluster tool 504, a robot disposed in the second transfer chamber 521 may retrieve second masks from the thermal chamber 100 coupled to the second transfer chamber 512 and position the second masks in the second processing chambers 522A-522E. The robot disposed in the second transfer chamber 521 may receive the substrates from the second pass through chamber 520 and position the substrates in the second processing chambers 522A-522E utilizing the second masks to deposit a second layer on the substrates. It is to be understood that while the transfer chambers 511, 521 have been shown as eight sided transfer chambers able to accommodate up to eight chambers coupled thereto, other sized transfer chambers are contemplated such as six sided transfer chambers. Additionally, it is to be understood that the processing chambers 512A-512E, 522A-522E may comprise suitable chambers for processing substrates such as PECVD, CVD, ALD, PVD, annealing, etching, and other chambers.

As described above, the chamber 100 may improve the processing system 500 by improving the efficiency of mask utilization within the system 500. New masks and used masks may be efficiently exchanged to the processing chambers to improve throughput of the system. The heating and cooling of the masks performed in the thermal chamber 100 enables the processing system to process substrate more quickly because the masks do not need to be heated or cooled in the processing chambers. Additionally, the thermal chamber 100 may be utilized as an intra-cluster tool buffer chamber by storing substrates in line for processing.

While the foregoing is directed to embodiments of the present disclosure, other and further embodiments of the disclosure may be devised without departing from the basic scope thereof, and the scope thereof is determined by the claims that follow.

What is claimed is:

1. A thermal chamber, comprising:
   a chamber body defining a volume sized to receive one or more masks and substrates therein;
   a lid member slidably coupled to an upper portion of the chamber body outside the volume, the lid member configured to enclose the volume when the lid member is located in a closed position;
   a heating member coupled to the chamber body within the volume;
   a temperature measurement member coupled to chamber body;
   a platform disposed within the volume opposite to the lid member, wherein the platform is movably coupled to the chamber body; and
   a pumping apparatus configured to generate a vacuum in the volume.

2. The thermal chamber of claim 1, wherein the platform is coupled to a first linear actuator configured to translate the platform through the volume.

3. The thermal chamber of claim 2, wherein the linear actuator is a ball screw apparatus.

4. The thermal chamber of claim 2, wherein the linear actuator is configured to translate the platform in a first direction.

5. The thermal chamber of claim 4, wherein a track member is configured to slidably translate the lid member in a second direction perpendicular to the first direction.

6. The thermal chamber of claim 5, wherein a track member is configured to slidably translate the lid member relative to the chamber body.

7. The thermal chamber of claim 5, wherein the track member is coupled to the chamber body.

8. The thermal chamber of claim 1, wherein one or more second actuators are configured to decouple the lid member from the chamber body.

9. The thermal chamber of claim 1, wherein the heating member is a reflective heater.

10. The thermal chamber of claim 1, wherein the temperature measurement member is a thermocouple.

11. The thermal chamber of claim 1, wherein the pumping apparatus is a cryogenic pump.

12. A thermal chamber, comprising:
    a chamber body defining a volume sized to receive one or more masks and substrates therein;
    a lid member coupled to an upper portion of the chamber body outside the volume, the lid member configured to enclose the volume when the lid member is located in a closed position;
    a reflective heating member coupled to the chamber body within the volume;
    a thermocouple coupled to chamber body; and
    a platform coupled to the chamber body and movably disposed within the volume.

13. The thermal chamber of claim 12, further comprising:
    a first actuator coupled to the chamber body, the first actuator configured to translate the platform in a first direction through the volume.

14. The thermal chamber of claim 13, further comprising:
    a second actuator coupled to the chamber body, the second actuator configured to translate the lid member in a second direction perpendicular to the first direction.

15. The thermal chamber of claim 12, further comprising:
    a pumping apparatus configured to generate a vacuum in the volume.

16. The thermal chamber of claim 15, wherein the pumping apparatus is a cryogenic pump.

17. A thermal chamber, comprising:
    a chamber body defining a volume sized to receive one or more masks and substrates therein;
    a lid member slidably coupled to an upper portion of the chamber body outside the volume, the lid member configured to enclose the volume when the lid member is located in a closed position;
    a reflective heater coupled to the chamber body within the volume;
    a temperature measurement member coupled to chamber body; and
    a platform disposed within the volume opposite to the lid member, wherein the platform is movably coupled to the chamber body.

18. The thermal chamber of claim 17, wherein the platform is coupled to a linear actuator configured to translate the platform through the volume.

19. The thermal chamber of claim 18, wherein the linear actuator is configured to translate the platform in a first direction.

20. The thermal chamber of claim 19, wherein a track member is configured to slidably translate the lid member relative to the chamber body.

21. A thermal chamber, comprising:
    a chamber body defining a volume sized to receive one or more masks and substrates therein;
    a lid member slidably coupled to an upper portion of the chamber body outside the volume, the lid member configured to enclose the volume when the lid member is located in a closed position;

a heating member coupled to the chamber body within the volume;

a temperature measurement member coupled to chamber body; and a platform disposed within the volume opposite to the lid member, wherein the platform is movably coupled to the chamber body, wherein the platform is coupled to a first linear actuator configured to translate the platform through the volume in a first direction, and wherein a track member is configured to slidably translate the lid member in a second direction perpendicular to the first direction.

\* \* \* \* \*